（12） United States Patent
Mohammadi-Gheidari et al.

(10) Patent No.: US 11,961,709 B2
(45) Date of Patent: Apr. 16, 2024

(54) CHARGED PARTICLE BEAM DEVICE FOR INSPECTION OF A SPECIMEN WITH A PLURALITY OF CHARGED PARTICLE BEAMLETS

(71) Applicant: FEI Company, Hillsboro, OR (US)

(72) Inventors: Ali Mohammadi-Gheidari, Eindhoven (NL); Erik René Kieft, Eindhoven (NL); Pieter Kruit, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 17/873,778

(22) Filed: Jul. 26, 2022

(65) Prior Publication Data

US 2024/0006149 A1 Jan. 4, 2024

Related U.S. Application Data

(63) Continuation of application No. 16/778,468, filed on Jan. 31, 2020, now abandoned.

(30) Foreign Application Priority Data

Feb. 27, 2019 (EP) .................................. 19159590.9

(51) Int. Cl.
*H01J 37/317* (2006.01)
*H01J 37/12* (2006.01)
*H01J 37/244* (2006.01)

(52) U.S. Cl.
CPC .......... *H01J 37/3177* (2013.01); *H01J 37/12* (2013.01); *H01J 37/244* (2013.01); *H01J 2237/0453* (2013.01); *H01J 2237/1534* (2013.01); *H01J 2237/2817* (2013.01)

(58) Field of Classification Search
CPC ...... H01J 37/3177; H01J 37/12; H01J 37/244; H01J 2237/0453; H01J 2237/1534; H01J 2237/2817

See application file for complete search history.

(56) References Cited

U.S. PATENT DOCUMENTS

| 6,965,153 B1 * | 11/2005 | Ono ..................... | H01J 37/3007 250/492.23 |
| 8,026,495 B2 * | 9/2011 | Platzgummer ...... | H01J 37/3023 250/492.3 |

(Continued)

*Primary Examiner* — Sean M Luck

(57) ABSTRACT

The invention relates to a charged particle beam device for inspection of a specimen with a plurality of charged particle beamlets. The charged particle beam device comprises a specimen holder for holding a specimen; a source for producing a beam of charged particles; and an illuminator for converting said beam of charged particles into a plurality of charged particle beamlets and directing said plurality of charged particle beamlets onto said specimen. According to the disclosure, the illuminator comprises a multi-aperture lens plate having a plurality of apertures for defining the corresponding plurality of charged particle beamlets; as well as at least a first electrode for generating an electrical field at a surface of the multi-aperture lens plate. The apertures in said multi-aperture lens plate have a noncircular cross-sectional shape to correct for neighbouring aperture induced aberrations. This allows for decreased spot size, and with this imaging resolution of the device is increased.

20 Claims, 4 Drawing Sheets

(56) References Cited

U.S. PATENT DOCUMENTS

| | | | | |
|---|---|---|---|---|
| 2005/0242302 A1* | 11/2005 | Platzgummer | ........ | H01J 37/045 250/492.22 |
| 2005/0242303 A1* | 11/2005 | Platzgummer | ........... | G21K 1/08 250/492.22 |
| 2006/0289804 A1* | 12/2006 | Knippelmeyer | ....... | B82Y 40/00 250/492.22 |
| 2009/0026389 A1* | 1/2009 | Platzgummer | ...... | H01J 37/3177 250/492.2 |
| 2010/0224790 A1* | 9/2010 | Platzgummer | ......... | B82Y 40/00 250/400 |
| 2010/0270474 A1* | 10/2010 | Platzgummer | ......... | B82Y 10/00 250/396 R |
| 2011/0068276 A1* | 3/2011 | Kruit | ........................ | H01J 37/12 250/396 R |
| 2012/0292524 A1* | 11/2012 | Wieland | ................. | B82Y 10/00 250/398 |
| 2013/0187046 A1* | 7/2013 | Zeidler | ................... | B82Y 40/00 250/440.11 |
| 2013/0248731 A1* | 9/2013 | Tanimoto | ............... | H01J 37/153 250/396 R |
| 2014/0224985 A1* | 8/2014 | Rodgers | ................... | H01J 37/29 250/307 |
| 2016/0336142 A1* | 11/2016 | Liu | ......................... | H01J 37/28 |
| 2017/0148609 A1* | 5/2017 | Cook | ..................... | H01J 37/147 |
| 2018/0254167 A1* | 9/2018 | Zhao | ...................... | H01J 37/20 |
| 2019/0019649 A1* | 1/2019 | Winkler | ................. | H01J 37/147 |

\* cited by examiner

CHARGED PARTICLE BEAM DEVICE FOR INSPECTION OF A SPECIMEN WITH A PLURALITY OF CHARGED PARTICLE BEAMLETS

CROSS-REFERENCE TO RELATED APPLICATIONS

This application is a continuation application under 35 U.S.C. § 120 of pending U.S. application Ser. No. 16/778,468, filed Jan. 31, 2020. The entire contents of the aforementioned application are incorporated by reference herein.

FIELD OF THE INVENTION

The present description relates generally to systems for multi-beam charged particle microscopy, and more particularly, to a multi-aperture lens plate in a multi-beam charged particle microscopy.

BACKGROUND OF THE INVENTION

A charged particle beam device for inspection of a specimen with a plurality of charged particle beamlets comprises: a specimen holder for holding a specimen; a source for producing a beam of charged particles; and an illuminator for converting said beam of charged particles into a plurality of charged particle beamlets and directing said plurality of charged particle beamlets onto said specimen.

In known systems, the illuminator comprises a multi-aperture lens plate having a plurality of apertures for defining the corresponding plurality of charged particle beamlets; as well as at least a first electrode for generating an electrical field at a surface of the multi-aperture lens plate. A thin plate of conductive material with an array of apertures (typically, a regular square pattern of round holes) is used in multi-beam charged particle systems. The aperture array typically plays a double role. First, the apertures define the individual beamlets as they are cut out of a single, large beam that is emitted by (for example) a field emitter gun. Hence, they serve as beam limiting apertures for the individual beamlets. Second, if there is an electric field at least on one side of the plate, and a different field on the other side, then the individual apertures serve as (micro) lenses for the beamlets. Hence, (virtual) crossovers are created for the beamlets in a different plane than the common crossovers for the beam as a whole. This allows (for example) to focus the beamlets as probes on a specimen in a regular pattern. Alternatively, a different aperture array can be used for the lensing than the one that is used for the beam definition.

Although the multi-beamlet device described above provides satisfactory results, it was found that the imaging resolution of the multi-beamlet device is lacking to some extent. This is particularly true compared to single beam devices.

SUMMARY

In one embodiment, a charged particle beam device for inspection of a specimen with a plurality of charged particle beamlets comprises a specimen holder for holding a specimen; a source for producing a beam of charged particles; an illuminator for converting said beam of charged particles into a plurality of charged particle beamlets and directing said plurality of charged particle beamlets onto said specimen, wherein said illuminator comprises: a multi-aperture lens plate having a plurality of apertures for defining the corresponding plurality of charged particle beamlets, wherein said apertures have a noncircular cross-sectional shape; and a first electrode for generating an electrical field at a surface of the multi-aperture lens plate; and a detector for detecting a flux of radiation emanating from the specimen in response to said irradiation by said plurality of charged particle beamlets. In this way, Resolution of the multi-beam charged particle device is improved.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

Like reference numerals refer to corresponding parts throughout the several views of the drawings.

DETAILED DESCRIPTION OF EMBODIMENTS

Figure 1:
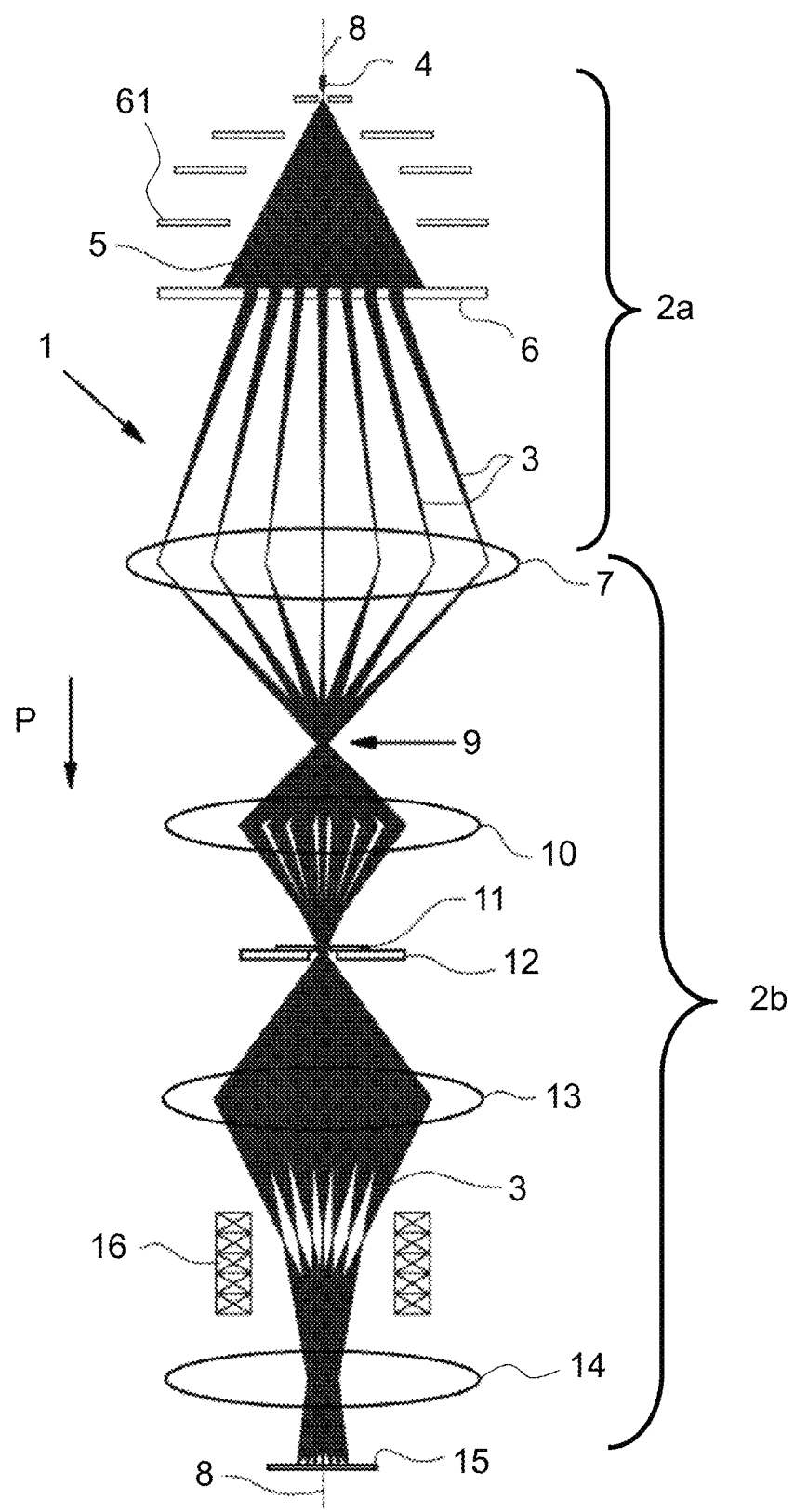
FIG. 1 shows an example of a charged particle beam device.

A multi-beam charged particle beam device may comprise a multi-aperture lens plate having a plurality of apertures for defining the corresponding plurality of charged particle beamlets. To improve the imaging resolution of the entire device, the apertures in said multi-aperture lens plate have a noncircular cross-sectional shape. Each of the noncircular cross-sectional shape is arranged for reducing aberrations resulting from neighbouring apertures. It was found that when the different apertures in the array are sufficiently close together (i.e., when the ratio of holes to surrounding material is sufficiently high), then the fields of neighbouring aperture lenses will tend to overlap. This leads to various types of lens aberrations, which increases the spot size of the respective beamlet, and decreases the imaging resolution. By providing a noncircular cross-sectional shape for the plurality of apertures in said multi-aperture lens plate, these aberrations are reduced, and with this the spot size of the respective beamlet is improved as well. In particular, the spot can be made more round and smaller, which improves the respective imaging resolution of the respective beamlet. Hence, the object as defined herein is achieved.

Advantageous embodiments will be discussed below.

In an embodiment, the multi-aperture lens plate comprises a regular grid of apertures. The apertures in the regular grid may be given the same shape and/or orientation. Said regular grid of apertures may comprise a rectangular or square pattern of apertures. As an example, a given central aperture in such a grid is directly surrounded by four neighbouring apertures (i.e. one above, one below, one left, and one right) and each of these neighbouring apertures is provided at substantially the same distance from said central aperture. It is noted that such a central aperture has diagonally neighbouring apertures as well, located at a further distance compared to the four directly neighbouring apertures. The noncircular shape of the central aperture is mainly provided to correct for aberrations caused by the four directly neighbouring apertures and may be used to correct for the diagonally neighbouring apertures as well. In an embodiment, neighbouring apertures are given the similar shape, and in particular also the similar orientation, for reducing aberrations caused by fields of neighbouring aperture lenses.

It is noted that in a regular grid of n×m apertures, where n≥3 and m≥4, a plurality of the aforementioned central apertures are provided. In an embodiment, each of these central apertures is given a similar noncircular cross-sectional shape for reducing the aberrations caused by their respective four neighbouring apertures. The central apertures may be given the same dimension as well. This way, the central apertures in this embodiment are identical, which allows the production of the multi-aperture lens plate to take place in an effective manner.

It is noted that in the regular grid the side apertures are directly neighboured by only three apertures. A somewhat different shape may be used for these side apertures. In an embodiment, however, the shape of all apertures in said multi-aperture lens plate is identical. This means that the cross-sectional shape and dimensions of each of these apertures is substantially identical. Orientation of the apertures can be the same as well, meaning that the different apertures are aligned and orientated similarly. This allows for fast and effective manufacturing of the multi-aperture lens plate.

In an embodiment, the multi-aperture lens plate has a regular, square pattern of apertures. It was found that for such a grid fourfold astigmatism is the dominant aberration. By providing the apertures in said multi-aperture lens plate with a noncircular cross-section shape, it is possible to minimize this fourfold astigmatism, and, by generalization, other non-axisymmetric aberrations.

As non-limiting examples of noncircular cross-sectional shapes, the following shapes may be used: oval, ellipsoid, rounded square or rounded rectangular cross-sectional. Other shapes are conceivable as well.

In an embodiment, the apertures have a substantially continuously curved perimeter. This means that there are no sharp edges in the perimeter, such as corners. A continuously curved perimeter provides predictable aberration correction and is relatively easy to manufacture.

In an embodiment, the cross-sectional shape has a first axis as measured in a first direction, and a second axis as measured in a second direction substantially orthogonal to the first direction, wherein the second axis is larger than the first diameter. The shape may be oval, ellipsoid or rounded rectangular in this case, for example.

In an embodiment, the cross-sectional shape has at least two axes of symmetry. The shape may be oval, ellipsoid or rounded rectangular in this case, for example.

In a further embodiment, the cross-sectional shape has at least four axes of symmetry. The shape may rounded square in this embodiment, for example.

To further enhance the ability to correct for neighbouring aperture induced aberrations, the aperture plate additionally comprises, in an embodiment, at least one beamlet shape tuning element provided in between adjacent apertures and arranged for locally modifying said electrical field at said surface of the multi-aperture lens plate.

According to an aspect, this beamlet shape tuning element may be used separate from the noncircular cross-sectional shape. According to this aspect, a charged particle beam device for inspection of a specimen with a plurality of charged particle beamlets is provided, wherein said charged particle beam device comprises:

A specimen holder for holding a specimen;
A source for producing a beam of charged particles;
An illuminator for converting said beam of charged particles into a plurality of charged particle beamlets and directing said plurality of charged particle beamlets onto said specimen, wherein said illuminator comprises:
multi-aperture lens plate having a plurality of apertures for defining the corresponding plurality of charged particle beamlets; as well as
at least a first electrode for generating an electrical field at a surface of the multi-aperture lens plate; and
A detector for detecting a flux of radiation emanating from the specimen in response to said irradiation by said plurality of charged particle beamlets;
wherein the aperture plate additionally comprises at least one beamlet shape tuning element provided in between adjacent apertures and arranged for locally modifying said electrical field at said surface of the multi-aperture lens plate.

Embodiments of the beamlet shape tuning element will be discussed below.

In an embodiment, said beamlet shape tuning element comprises a recess in said multi-aperture lens plate. In particular, said recess is a blind hole.

In a further embodiment, said beamlet shape tuning element comprises a protrusion on said multi-aperture lens plate.

Said beamlet shape tuning element may be a wall element provided about the circumference of the aperture. In particular, said beamlet shape tuning element may be a circumferential protrusion extending from the aperture plate, and provided around the edge of the aperture.

In another embodiment, said beamlet shape tuning element is provided substantially halfway in between said adjacent apertures, such that it influences both adjacent apertures in a similar way.

It is conceivable that the beamlet shape tuning element has a circular cross-sectional shape, with a diameter of said beamlet shape tuning element in between 0.25 to 0.75 of a diameter of said apertures, and in particular equal to 0.5.

According to an aspect, a multi-aperture lens plate for a charged particle beam device as disclosed herein is provided, wherein said multi-aperture lens plate has a plurality of apertures arranged for defining a corresponding plurality of charged particle beamlets in use of said charged particle beam device, wherein said apertures in said multi-aperture lens plate have a noncircular cross-sectional shape.

Advantages of such a charged particle beam device have been elucidated above. Embodiments of the charged particle beam device may include embodiments of the multi-aperture lens plate as described herein.

Turning to FIG. 1, an example of a charged particle beam device, in the form of a Multi-Beam Scanning Electron Microscope (MBSEM), is shown. The MBSEM 1 comprises a multi beam charged particle generator 2a for generating an array of primary charged particle beams 3, in this case an array of primary electron beams 3. The multi beam electron generator 2a comprises at least one electron source 4 for generating a diverging electron beam 5. The diverging electron beam 5 is split into an array of focused primary electron beams 3 by an aperture lens array 6. The primary electron beams 3 are subsequently directed towards a sample 15, as schematically indicated by the arrow P.

The multiple images of the source 4 are positioned on the object principle plane of an accelerator lens 7. The accelerator lens 7 directs the primary electron beams 3 towards the optical axis 8 and creates a first common cross-over 9 of all the primary electron beams 3.

The first common cross-over 9 is imaged by the magnetic condenser lens 10 onto a variable aperture 11 that acts as a current limiting aperture. At the variable aperture 11 a second common cross-over of all the primary electron beams 3 is created.

The MBSEM comprises a lens system 13, 14 for directing the primary charged particle beams from the common cross-over at the variable aperture 11 towards the sample surface 15 and for focusing all primary charged particle beams 3 into an array of individual spots on the sample surface 15. The lens system comprises an intermediate magnetic lens 13 for imaging the variable aperture 11 onto a coma free plane of the objective lens 14, which objective lens 14 creates an array of focused primary electron beams on the sample surface 15.

In addition the MBSEM is provided with scan coils 16 for scanning the array of focused primary electron beams over the sample surface 15.

The MBSEM shown in this embodiment is furthermore provided with a position sensitive secondary electron detector 12 positioned at least substantially in or near a plane comprising a common cross-over, in this case directly below the variable aperture 11. This secondary electron detection system 12 is arranged to acquire the individual secondary electron image of each single primary electron beam spot on the sample surface 15. This means, that when the sample surface 15 is scanned in this MBSEM 1, multiple images can be acquired at the same time in one single scan period.

The charged particle beam device 1 as shown in FIG. 1 is arranged for inspection of a specimen 15 with a plurality of charged particle beamlets 3. The charged particle beam device comprises a specimen holder 15 for holding a specimen; a source 4 for producing a beam 5 of charged particles; an illuminator 2b for converting said beam 5 of charged particles into a plurality of charged particle beamlets 3 and directing said plurality of charged particle beamlets 3 onto said specimen 15. The illuminator 2b comprises a multi-aperture lens plate 6 having a plurality of apertures for defining the corresponding plurality of charged particle beamlets; as well as at least a first electrode 61 for generating an electrical field at a surface of the multi-aperture lens plate 6; and a detector 12 for detecting a flux of radiation emanating from the specimen 15 in response to said irradiation by said plurality of charged particle beamlets. It is noted that the general setup as shown here in FIG. 1 is known to those skilled in the art, for example from EP 2 864 997 B1, and modifications to this set up are known to those skilled in the art as well.

The charged particle device 1 as disclosed herein comprises a multi-aperture lens plate 6, wherein the apertures in said multi-aperture lens plate 6 have a noncircular cross-sectional shape. This will be discussed in more detail with respect to several embodiments as shown in FIG. 2 to FIG. 7. With the multi-aperture lens plate, imaging resolution is improved.

Figure 2:
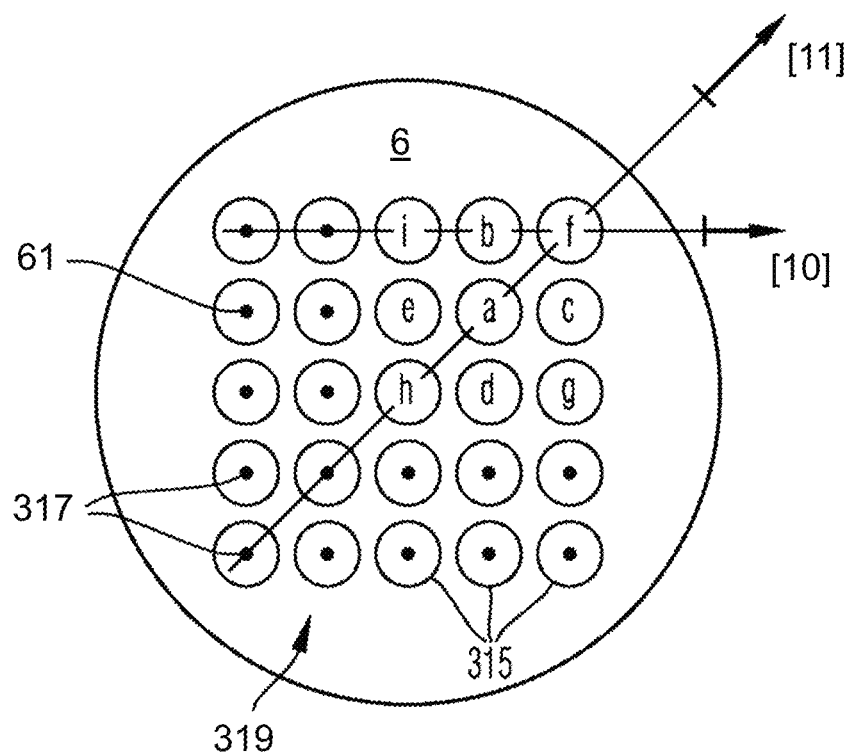
FIG. 2 shows one embodiment of a multi-aperture lens plate.

FIG. 2 shows a regular grid 319 of apertures 315 formed in a multi-aperture plate 6. Each non-peripheral aperture, or central aperture, "a" has four directly neighbouring apertures "b", "c", "d" and "e", and it has four second closest neighbouring apertures, or diagonally neighbouring, "f", "g", "h" and "i". FIG. 2 indicates a basic array vector in which apertures 315 are arrayed at the closest neighbour pitch, and FIG. 2 indicates a basic array vector in which the apertures 315 are arrayed with a second closest neighbour pitch. As disclosed herein, the apertures 315 in said multi-aperture lens plate 6 have a noncircular cross-sectional shape, as better shown in the various embodiments of FIG. 3a-d.

Figure 3A:
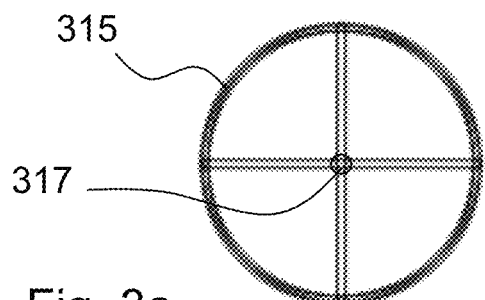
FIGS. 3a, 3b, 3c, and 3d show example apertures of the multi-aperture lens plate.
Figure 3B:
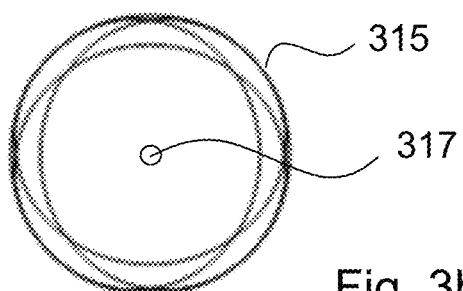
Figure 3C:
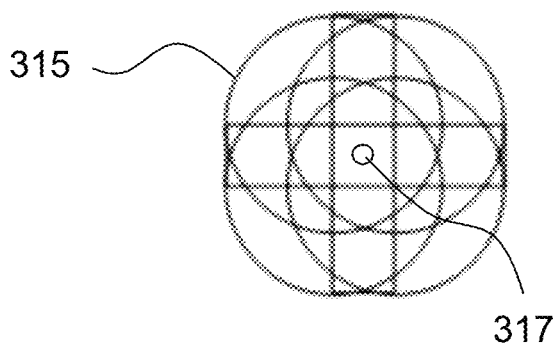

Each of the apertures 315 shown in FIG. 3a-3d is non-circular in cross-sectional shape and arranged for reducing aberrations resulting from (directly) neighbouring apertures. In FIG. 3a, and shown more clearly in FIG. 3c, the perimeter of the aperture 315 is defined by four circles that have an offset with respect to each other, and interconnected by means of straight edges. FIG. 3b, and shown more clearly in FIG. 3d, the perimeter of the aperture 315 is defined by four ellipsoid or oval shapes that have an offset with respect to each other. In all FIGS. the perimeter of the aperture 315 is continuously curved, meaning that there is a smooth transition between the different parts of the perimeter. In other words, along its full perimeter, the curve is differentiable at substantially any location of the curve.

Using these apertures 315 for at least the central apertures "e", "a", "h", "d" in the multi-aperture lens plate 6 as shown in FIG. 2, leads to a reduction of aberrations induced by neighbouring apertures, and decreases the spot size of the respective beamlet 3 on the specimen. All in all, this increases the imaging resolution of the charged particle device as disclosed herein. Preferably, all apertures use an identical cross-sectional shape.

From FIG. 3a-d it can be seen that the apertures 315 comprise a fourfold symmetry about a center 317 of the given aperture 315. This way it is possible to minimize the fourfold astigmatism associated with the multi-aperture lens plate 6 having a regular square grid of apertures 315.

Figure 3D:
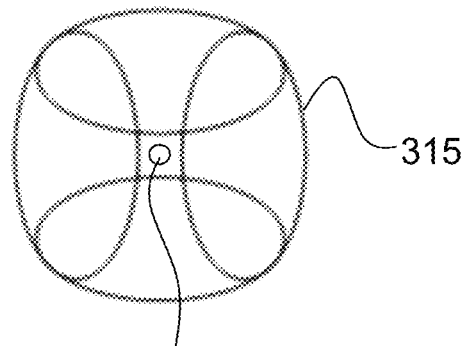

It is noted that there are multiple ways of introducing the noncircular apertures, including making 'squares' with rounded corners (FIGS. 3a and 3c), and joining four ellipses together (FIGS. 3b and 3d). In the first case, for hole diameters of, for example, (approximately) 18 micron on a grid with 25 micron spacing, good results were obtained for a radius of curvature of ~8.8 micron in each corner, so that the circular sections are joined together by just 0.4 micron straight sections on all sides. For ellipses, good results were obtained, for example, where the ratio of long to short axis (aspect ratio) of the ellipses is around 1.08. Both variants described above are capable of compensating the octupole field of the neighbouring holes (that is causing the four-fold astigmatism) but they slightly differ in how much higher-order aberration (mainly 8-fold astigmatism) they are causing. In this respect, the version with ellipses provided better results.

Figure 4:
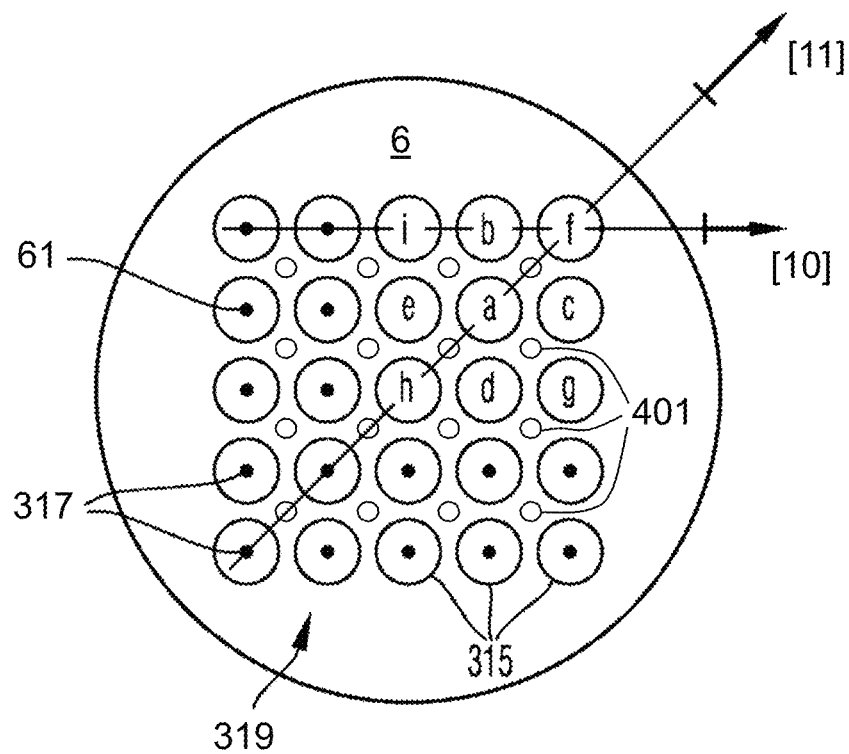
FIG. 4 shows another embodiment of the multi-aperture lens plate.

FIG. 4 shows a multi-aperture lens plate 6 according to an embodiment, that includes beamlet shape tuning elements 401 provided in between diagonally adjacent apertures 315 and arranged for locally modifying said electrical field at said surface of the multi-aperture lens plate 6. The use of the beamlet shape tuning elements 401 may aid in further correcting neighbouring aperture induced aberrations. As previously noted, the use of the beamlet shape tuning elements 401 may be in addition to the non-circular apertures 315, but the beamlet shape tuning elements 401 may be used together with circular apertures as well.

Figure 5:
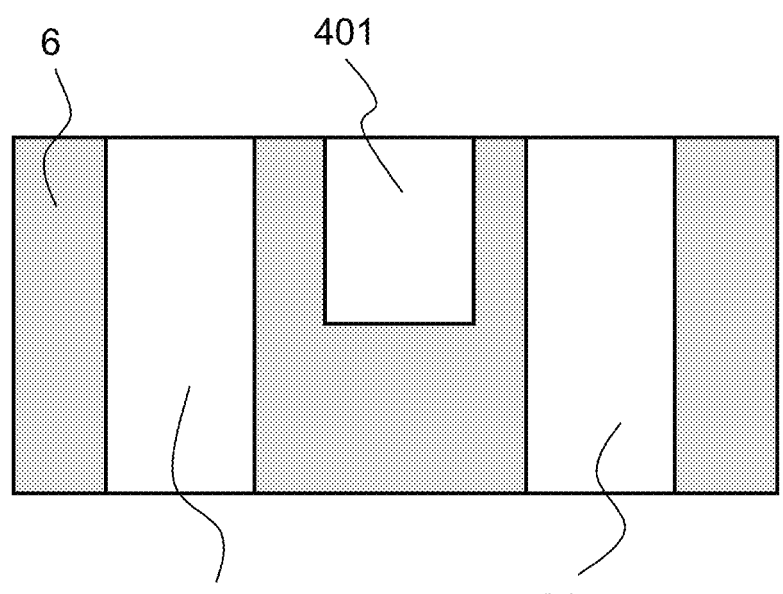
FIG. 5 is the cross-sectional view of a first example of the multi-aperture lens plate.

FIG. 5 schematically shows a first example of the multi-aperture lens plate 6 having a grid of apertures 315, and provided with a beamlet shape tuning element 401. In this example, the beamlet shape tuning element 401 is a blind hole provided in the multi-aperture lens plate 6.

Figure 6:
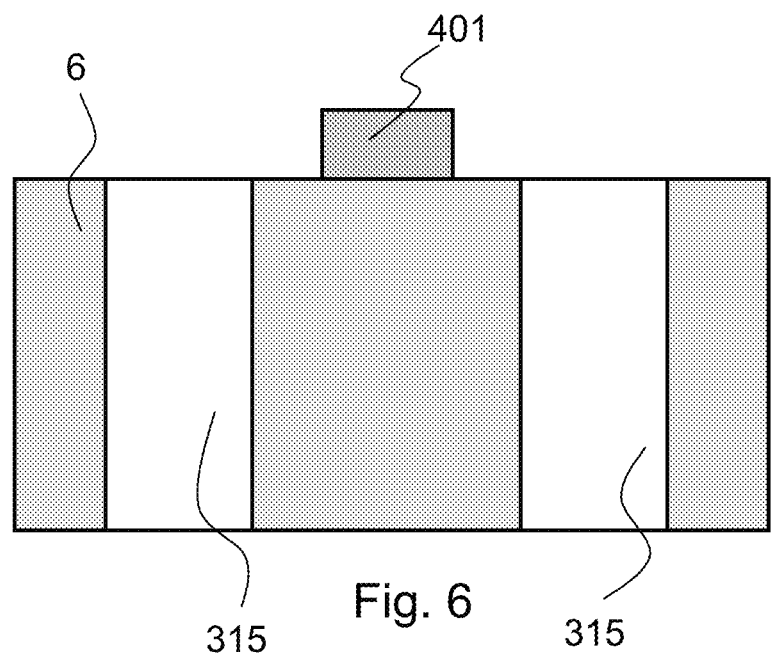
FIG. 6 is the cross-sectional view of a second example of the multi-aperture lens plate.

FIG. 6 schematically shows a second example of the multi-aperture lens plate 6 having a grid of apertures 315, wherein the beamlet shape tuning element 401 is provided as a protrusion on the multi-aperture lens plate 6.

Figure 7:
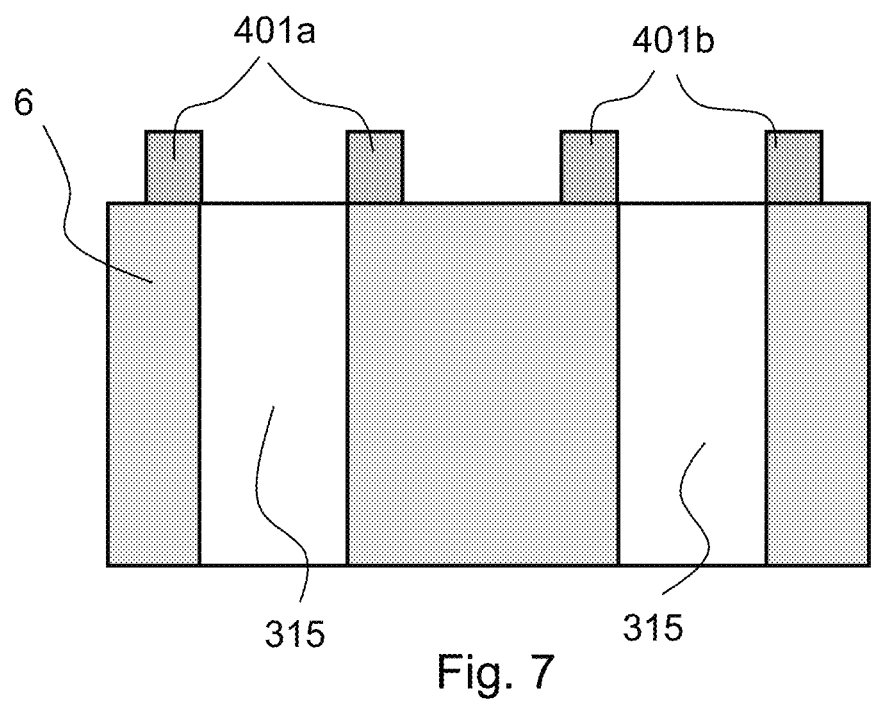
FIG. 7 is the cross-sectional view of a third example of the multi-aperture lens plate.

FIG. 7 schematically shows a third example of the multi-aperture lens plate 6 having a grid of apertures 315, wherein the beamlet shape tuning element 401a, 401b is provided as a protruding wall element surrounding the circumference of the respective aperture 315. In particular, the wall element 401a, 401b is provided along the full perimeter of the apertures 315. It was found that the embodiments shown in FIG. 5-7 provide improved results in controlling aberrations induced by neighbouring apertures.

It is noted that in the embodiments shown in FIG. 5-7, the apertures 315 have a non-circular cross-sectional shape as disclosed herein (not visible in the FIGS.). However, the beamlet shape tuning elements 401, 401a, 401b may be used as a standalone feature as well, i.e. with apertures 315 having circular cross-sectional shapes.

The desired protection is conferred by the appended claims.

The invention claimed is:

1. A charged particle beam device for inspection of a specimen with a plurality of charged particle beamlets, the charged particle beam device comprising:
   A specimen holder for holding a specimen;
   A source for producing a beam of charged particles;
   An illuminator for converting said beam of charged particles into a plurality of charged particle beamlets and directing said plurality of charged particle beamlets onto said specimen, wherein said illuminator comprises:
      a multi-aperture lens plate having a plurality of apertures for defining the corresponding plurality of charged particle beamlets; as well as
      at least a first electrode for generating an electrical field at a surface of the multi-aperture lens plate; and
   A detector for detecting a flux of radiation emanating from the specimen in response to said irradiation by said plurality of charged particle beamlets;
   Characterized, in that the aperture plate additionally comprises at least one beamlet shape tuning element provided in between adjacent apertures and arranged for locally modifying said electrical field at said surface of the multi-aperture lens plate, wherein said beamlet shape tuning element comprises a protrusion on said multi-aperture lens plate.

2. Charged particle beam device according to claim 1, wherein said beamlet shape tuning element is a circumferential protrusion extending from the aperture plate, and provided around the edge of the aperture.

3. Charged particle beam device according to claim 1, wherein said apertures in said multi-aperture lens plate have a circular cross-sectional shape.

4. Charged particle beam device according to claim 1, wherein the apertures have a substantially continuously curved perimeter.

5. Charged particle beam device according to claim 1, wherein said apertures in said multi-aperture lens plate have a noncircular cross-sectional shape.

6. Charged particle beam device according to claim 5, wherein the cross-sectional shape has a first axis as measured in a first direction, and a second axis as measured in a second direction substantially orthogonal to the first direction, wherein the second axis is larger than the first diameter.

7. Charged particle beam device according to claim 5, wherein the cross-sectional shape has at least two axes of symmetry.

8. Charged particle beam device according to claim 7, wherein the cross-sectional shape has at least four axes of symmetry.

9. Charged particle beam device according to claim 5, wherein the apertures have an oval, ellipsoid, rounded square or rounded rectangular cross-sectional shape.

10. Charged particle beam device according to claim 1, wherein a diameter of said beamlet shape tuning element is in between 0.25 to 0.75 of a diameter of said apertures, and in particular equal to 0.5.

11. A multi-aperture lens plate for a charged particle beam device according to any one of the previous claims, wherein said multi-aperture lens plate has a plurality of apertures arranged for defining corresponding plurality of charged particle beamlets in use of said charged particle beam device, characterized, in that the aperture plate additionally comprises at least one beamlet shape tuning element provided in between adjacent apertures and arranged for locally modifying said electrical field at said surface of the multi-aperture lens plate, wherein said beamlet shape tuning element comprises a protrusion on said multi-aperture lens plate.

12. A multi-aperture lens plate according to claim 11, wherein said beamlet shape tuning element is a wall element provided about the circumference of the aperture.

13. A multi-aperture lens plate according to claim 11, wherein said apertures in said multi-aperture lens plate have a circular cross-sectional shape.

14. A multi-aperture lens plate according to claim 11, wherein said apertures in said multi-aperture lens plate have a noncircular cross-sectional shape.

15. A multi-aperture lens plate according to claim 14, wherein the apertures have a substantially continuously curved perimeter.

16. A multi-aperture lens plate according to claim 14, wherein the cross-sectional shape has a first axis as measured in a first direction, and a second axis as measured in a second direction substantially orthogonal to the first direction, wherein the second axis is larger than the first diameter.

17. A multi-aperture lens plate according to claim 14, wherein the cross-sectional shape has at least two axes of symmetry.

18. A multi-aperture lens plate according to claim 14, wherein the cross-sectional shape has at least four axes of symmetry.

19. A multi-aperture lens plate according to claim 14, wherein the apertures have an oval, ellipsoid, rounded square or rounded rectangular cross-sectional shape.

20. A multi-aperture lens plate according to claim 11, wherein a diameter of said beamlet shape tuning element is in between 0.25 to 0.75 of a diameter of said apertures, and in particular equal to 0.5.

* * * * *